United States Patent
Hwang et al.

(10) Patent No.: US 10,553,665 B2
(45) Date of Patent: Feb. 4, 2020

(54) FLEXIBLE DISPLAY DEVICE AND METHOD OF MANUFACTURING THE SAME

(71) Applicant: Samsung Display Co., Ltd., Yongin-si (KR)

(72) Inventors: Suhwan Hwang, Gwangmyeong-si (KR); Youngtae Choi, Cheonan-si (KR); Jongwoo Park, Seongnam-si (KR); Youngsun Hwang, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 100 days.

(21) Appl. No.: 15/860,579

(22) Filed: Jan. 2, 2018

(65) Prior Publication Data

US 2018/0204901 A1   Jul. 19, 2018

(30) Foreign Application Priority Data

Jan. 18, 2017  (KR) ........................ 10-2017-0008500

(51) Int. Cl.
*H01L 27/32* (2006.01)
*H01L 51/00* (2006.01)

(52) U.S. Cl.
CPC ...... *H01L 27/3276* (2013.01); *H01L 27/3248* (2013.01); *H01L 51/0097* (2013.01); *H01L 2227/323* (2013.01); *H01L 2251/5338* (2013.01)

(58) Field of Classification Search
CPC ............. H01L 27/3248; H01L 27/3276; H01L 27/323; H01L 27/1218; H01L 51/0097
See application file for complete search history.

(56) References Cited

U.S. PATENT DOCUMENTS

| | | | |
|---|---|---|---|
| 8,987,733 B2 | 3/2015 | Park et al. | |
| 2014/0232956 A1* | 8/2014 | Kwon | G02F 1/133305 349/12 |
| 2016/0035812 A1* | 2/2016 | Kwon | H01L 27/3276 257/40 |
| 2017/0346041 A1* | 11/2017 | Kim | H01L 27/3244 |
| 2018/0053455 A1* | 2/2018 | Zhang | H01L 51/0031 |

FOREIGN PATENT DOCUMENTS

KR  10-2015-0016053   2/2015
KR  10-2016-0080289   8/2016

* cited by examiner

*Primary Examiner* — Joseph M Galvin, III
(74) *Attorney, Agent, or Firm* — H.C. Park & Associates, PLC

(57) ABSTRACT

A flexible display device includes a substrate including a non-bending area and a bending area adjacent to the non-bending area, and a crack prevention pattern disposed in the bending area. The bending area includes a first area having a first stress when bending, a second area having a second stress less than the first stress when bending, and a third area having a third stress less than the second stress when bending. The crack prevention pattern includes a plurality of crack prevention lines. The number of the crack prevention lines in the first area is greater than the number of the crack prevention lines in the third area.

20 Claims, 14 Drawing Sheets

FLEXIBLE DISPLAY DEVICE AND METHOD OF MANUFACTURING THE SAME

CROSS-REFERENCE TO RELATED APPLICATION

This application claims priority from and the benefit of Korean Patent Application No. 10-2017-0008500, filed on Jan. 18, 2017, which is hereby incorporated by reference for all purposes as if fully set forth herein.

BACKGROUND

Field

Exemplary embodiments relate to display devices. More particularly, exemplary embodiments relate to flexible display devices including a bending area and methods of manufacturing the flexible display devices.

Discussion Of The Background

Recently, applications of a flexible display device that is bendable, rollable, or foldable when in use or during manufacture have been expanding.

A display device may include a flat area and a bending area that may be bent, rolled, or folded. Mechanical stresses may be applied to the bending area, and cracks may occur at an end of the bending area due to the mechanical stresses. When the cracks progress from the end to a center (or central) portion of the bending area, wirings disposed in the center portion of the bending area may be damaged, thereby inducing defects in the display device.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide a flexible display device in which progress of cracks in a bending area may be decreased or substantially prevented.

Exemplary embodiments provide a method of manufacturing a flexible display device in which progress of cracks in a bending area may be decreased or substantially prevented.

Additional aspects will be set forth in the detailed description which follows, and, in part, will be apparent from the disclosure, or may be learned by practice of the inventive concepts.

According to exemplary embodiments, a flexible display device may include a substrate including a non-bending area and a bending area adjacent to the non-bending area, and a crack prevention pattern disposed in the bending area. The bending area may include a first area having a first stress when bending, a second area having a second stress less than the first stress when bending, and a third area having a third stress less than the second stress when bending. The crack prevention pattern may include a plurality of crack prevention lines. The number of the crack prevention lines in the first area may be greater than the number of the crack prevention lines in the third area.

In an exemplary embodiment, the number of the crack prevention lines in the second area may be greater than the number of the crack prevention lines in the third area.

In an exemplary embodiment, the number of the crack prevention lines in the first area may be greater than the number of the crack prevention lines in the second area.

In an exemplary embodiment, the first area may have a minimum radius of curvature in the bending area. The second area may be a boundary between the non-bending area and the bending area. The third area may be disposed between the first area and the second area.

In an exemplary embodiment, the crack prevention pattern may include a metal.

In an exemplary embodiment, the crack prevention pattern may include an inorganic material.

In an exemplary embodiment, the crack prevention pattern may be disposed only (i.e., selectively disposed) in the bending area.

In an exemplary embodiment, the crack prevention pattern may extend from the bending area to a crack sensing portion disposed in the non-bending area. The crack sensing portion may sense a crack of the crack prevention pattern.

In an exemplary embodiment, the flexible display device may further include a wiring disposed in a center portion of the bending area. The crack prevention pattern may be disposed in a peripheral portion outside the center portion.

In an exemplary embodiment, the wiring and the crack prevention pattern may be disposed on substantially the same level over the substrate and include substantially the same material.

In order to achieve the object of the present disclosure described above, a flexible display device according to an exemplary embodiment may include a substrate including a non-bending area and a bending area adjacent to the non-bending area, and a crack prevention pattern disposed in the bending area. The bending area may include a bending axis and an adjacent area adjacent to the bending axis. The crack prevention pattern may include a plurality of crack prevention lines. A distance between the crack prevention lines in the bending axis may be less than a distance between the crack prevention lines in the adjacent area.

In an embodiment, a distance between the crack prevention lines at a boundary between the non-bending area and the bending area may be less than the distance between the crack prevention lines in the adjacent area and greater than the distance between the crack prevention lines in the bending axis.

In an exemplary embodiment, the flexible display device may further include a first organic insulation layer disposed on the substrate in the bending area and a second organic insulation layer disposed on the first organic insulation layer. The crack prevention pattern may be disposed between the first organic insulation layer and the second organic insulation layer.

In an exemplary embodiment, the flexible display device may further include a first organic insulation layer disposed on the substrate in the bending area, a second organic insulation layer disposed on the first organic insulation layer, and a third organic insulation layer disposed on the second organic insulation layer. The crack prevention lines may include a plurality of first crack prevention lines disposed between the first organic insulation layer and the second organic insulation layer, and a plurality of second crack prevention lines disposed between the second organic insulation layer and the third organic insulation layer.

In order to achieve the object of the present disclosure described above, in a method of manufacturing a flexible display device according to an exemplary embodiment, a substrate including a non-bending area and a bending area adjacent to the non-bending area may be prepared. The bending area may include a first area having a first stress when bending, a second area having a second stress less than the first stress when bending, and a third area having a third stress less than the second stress when bending. A crack prevention pattern may be formed on the substrate in a peripheral portion of the bending area. The crack prevention pattern may include a plurality of crack prevention lines. The number of the crack prevention lines in the first area may be greater than the number of the crack prevention lines in the third area.

In an exemplary embodiment, the number of the crack prevention lines in the second area may be greater than the number of the crack prevention lines in the third area.

In an exemplary embodiment, the number of the crack prevention lines in the first area may be greater than the number of the crack prevention lines in the second area.

In an exemplary embodiment, a first organic insulation layer may be formed on the substrate in the bending area before the formation of the crack prevention pattern. A second organic insulation layer may be formed on the first organic insulation layer to cover the crack prevention pattern after the formation of the crack prevention pattern.

In an exemplary embodiment, a wiring may be formed in a center portion inside the peripheral portion of the bending area. The crack prevention pattern and the wiring may be substantially simultaneously formed.

In an exemplary embodiment, an inorganic insulation layer may be formed in the non-bending area. The crack prevention pattern and the inorganic insulation layer may be substantially simultaneously formed.

The flexible display device according to the exemplary embodiments may include the crack prevention pattern including the crack prevention lines. The crack prevention lines may have different distances therebetween or different numbers of lines, corresponding to different stresses applied per the location in the bending area. Therefore, the crack prevention pattern may effectively block the progress of cracks occurring in the bending area.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
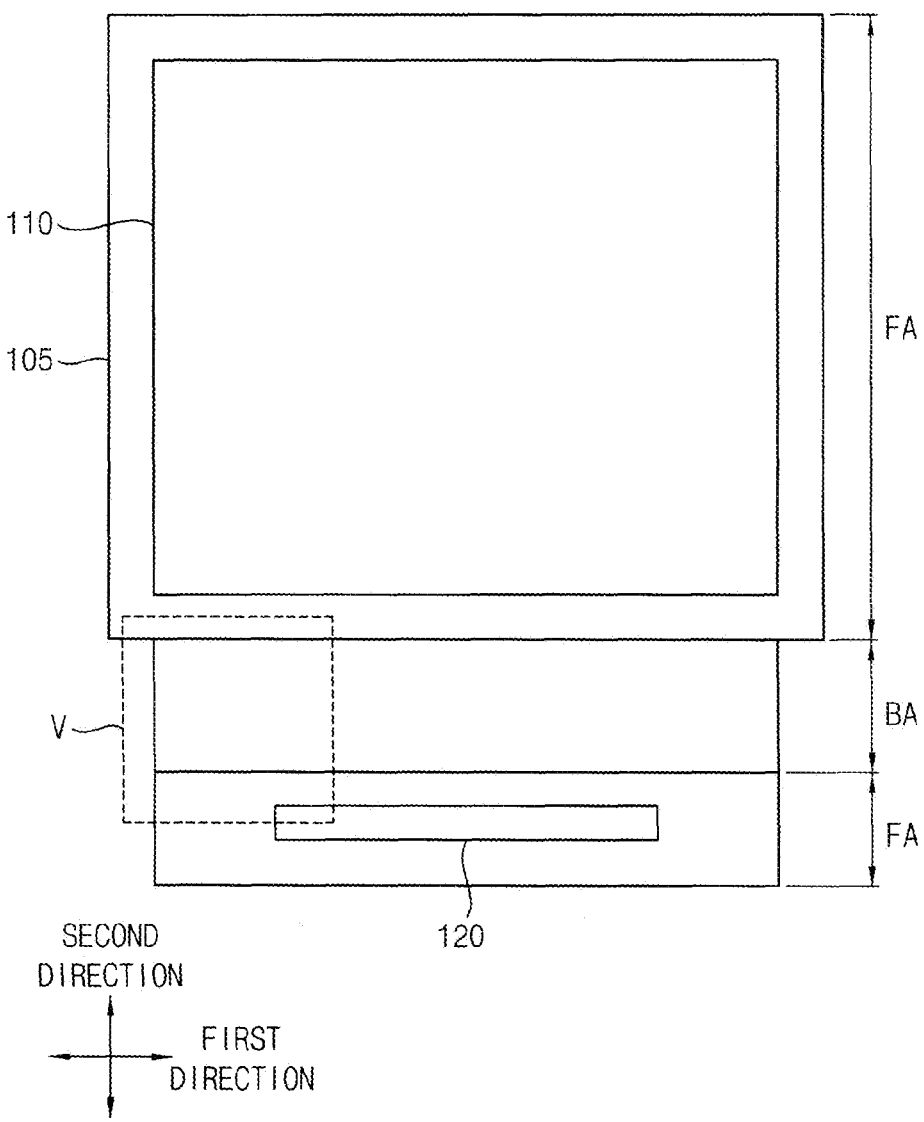
FIG. 1 is a plan view illustrating an unbent flexible display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a plan view illustrating an unbent flexible display device according to an exemplary embodiment.

Figure 2:
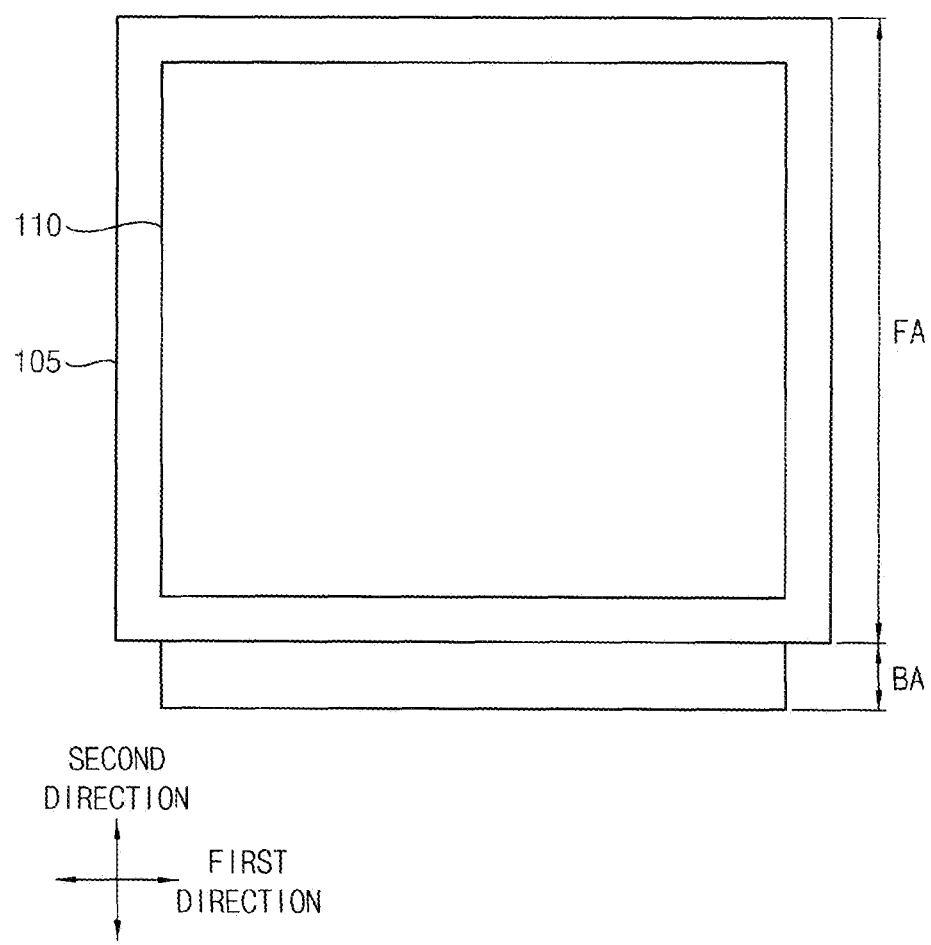
FIG. 2 is a plan view illustrating a bent flexible display device according to an embodiment.

FIG. 2 is a plan view illustrating a bent flexible display device according to an exemplary embodiment.

Figure 3:
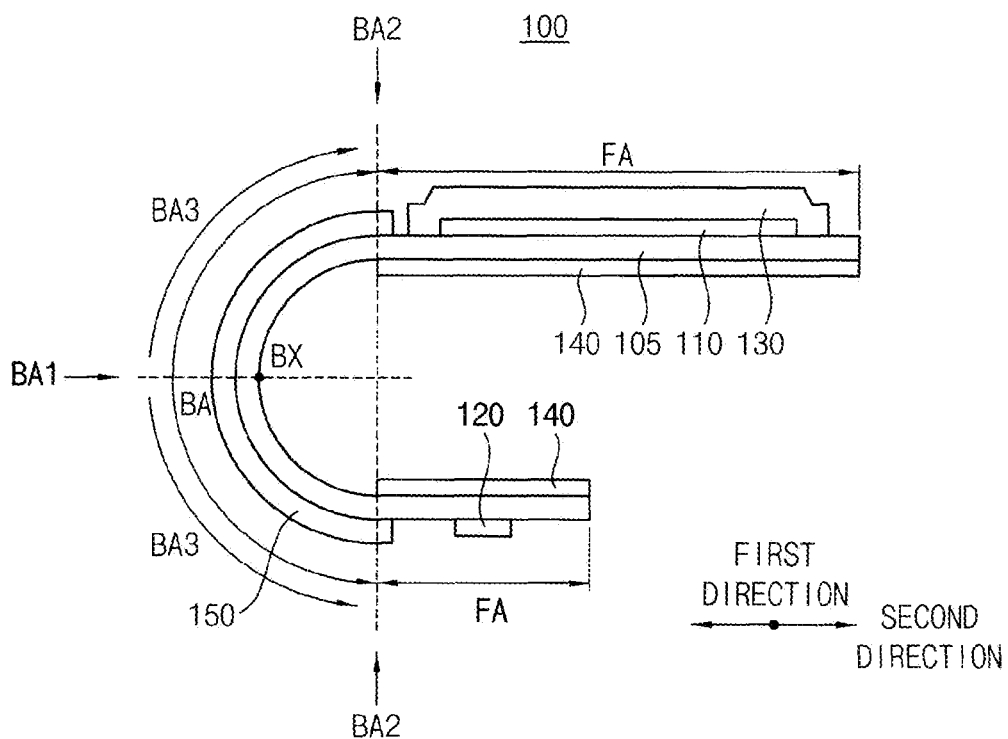
FIG. 3 is a side view illustrating a bent flexible display device according to an exemplary embodiment.

FIG. 3 is a side view illustrating a bent flexible display device according to an exemplary embodiment.

Referring to FIGS. 1, 2, and 3, a flexible display device 100 according to an exemplary embodiment may include a substrate 105 including a flat area FA (e.g., a non-bending area) and a bending area BA. The substrate 105 may include a flexible material that is bendable or foldable. For example, the substrate 105 may be formed of a plastic (e.g., polyimide (PI), polyethylene naphthalate (PEN), polyethylene terephthalate (PET), polyether ether ketone (PEEK), polyethersulfone (PES), polymethyl methacrylate (PMMA), polycarbonate (PC), and polypropylene (PP)), a thin glass, a thin metal, or the like.

The substrate 105 may have a substantially flat surface in the flat area FA. The substrate 105 may have a bent surface in the bending area BA. The bending area BA may be adjacent to the flat area FA. For example, the bending area BA may extend along a first direction, and the bending area BA may be adjacent to the flat area FA in a second direction substantially orthogonal to the first direction. The substrate 105 may include at least one flat area FA and at least one bending area BA. For example, the substrate 105 may include two flat areas FA, and one bending area BA disposed therebetween.

A display unit 110 may be disposed in the flat area FA that is disposed at one side of the bending area BA. The display unit 110 may be disposed on a first surface of the substrate 105. The display unit 110 may include a plurality of pixels, each emitting light. The display unit 110 may display an image composed of the lights emitted from the pixels.

Figure 4A:
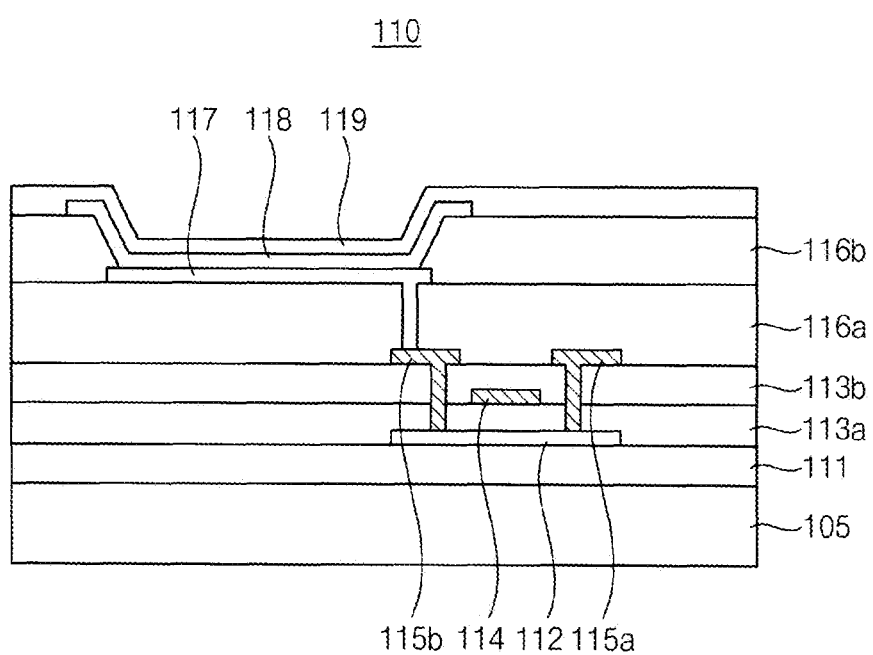
FIGS. 4A and 4B are cross-sectional views illustrating a display unit of the flexible display device in FIG. 1.
Figure 4B:
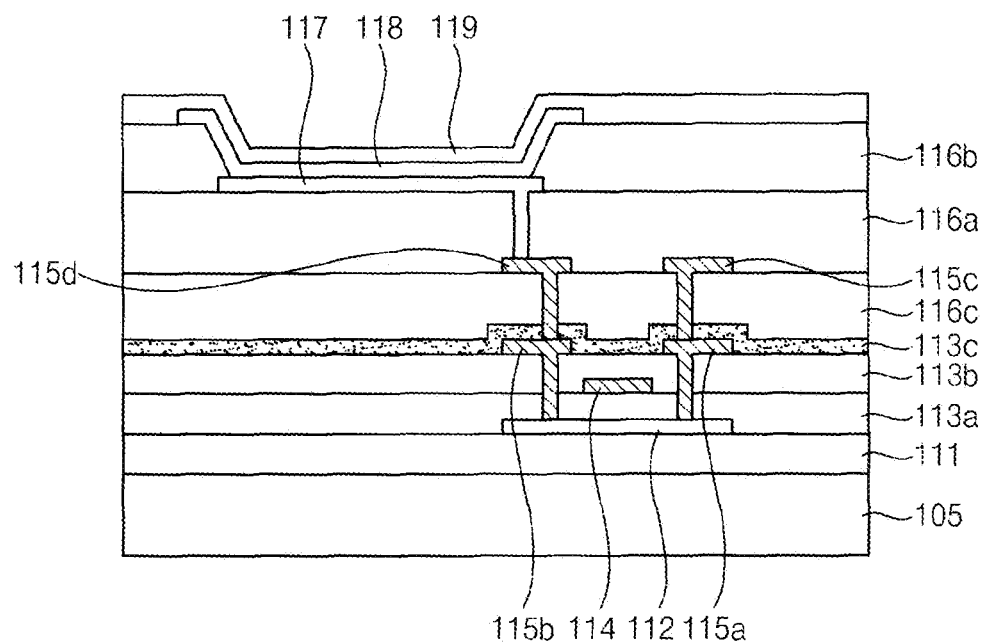

FIGS. 4A and 4B are cross-sectional views illustrating a display unit of the flexible display device in FIG. 1. For example, FIGS. 4A and 4B may be cross-sectional views illustrating one pixel included in the display unit 110. FIG. 4A may illustrate a display unit 110 according to an exemplary embodiment, but exemplary embodiments are not limited thereto.

Referring to FIG. 4A, a buffer layer 111 may be disposed on the substrate 105. The buffer layer 111 may have a flat surface, and the buffer layer 111 may block a permeation of impurities. The buffer layer 111 may include an inorganic material such as silicon oxide, silicon nitride, or the like. Alternatively, the buffer layer 111 may not be necessary.

A pixel circuit may be disposed on the buffer layer 111. The pixel circuit may include at least one transistor. FIG. 4A illustrates a top-gate type transistor including an active pattern 112, a gate electrode 114, and source/drain electrodes 115a and 115b. However, the pixel circuit may include various type transistors such as a bottom-gate type transistor or the like.

The active pattern 112 may be disposed on the buffer layer 111. The active pattern 112 may include a semiconductor material, for example, amorphous silicon or polycrystalline silicon. The active pattern 112 may include a source region and a drain region respectively being in contact with the source electrode 115a and the drain electrode 115b, and a channel region disposed therebetween.

A gate insulation layer 113a may be disposed on the active pattern 112. The gate insulation layer 113a may be an inorganic layer including an inorganic material such as silicon oxide, silicon nitride, or the like. The gate insulation layer 113a may insulate the gate electrode 114 from the active pattern 112.

The gate electrode 114 may be disposed on the gate insulation layer 113a. The gate electrode 114 may overlap the channel region of the active pattern 112. The gate electrode 114 may be connected to a gate line applying on/off signals to the transistor. For example, the gate electrode 114 may include a metal such as molybdenum (Mo), aluminum (Al), copper (Cu), titanium (Ti), or the like.

An insulation interlayer 113b may be disposed on the gate electrode 114. The insulation interlayer 113b may be an inorganic layer including an inorganic material such as silicon oxide, silicon nitride, or the like. The insulation interlayer 113b may insulate the source/drain electrodes 115a and 115b from the gate electrode 114.

The source electrode 115a and the drain electrode 115b may be disposed on the insulation interlayer 113b. The source electrode 115a and the drain electrode 115b may be in contact with the source region and the drain region, respectively, through contact holes formed in the insulation interlayer 113b and the gate insulation layer 113a. For example, the source electrode 115a and the drain electrode 115b may include a metal such as molybdenum (Mo), aluminum (Al), copper (Cu), titanium (Ti), or the like.

A via insulation layer 116a may be disposed on the source electrode 115a and the drain electrode 115b, and the via insulation layer 116a may cover the transistor. The via insulation layer 116a may have a flat surface alleviating a stepped portion induced by an uneven surface thereunder, and the via insulation layer 116a may prevent defects of structures thereover due to the uneven surface thereunder. For example, the via insulation layer 116a may be an organic layer including an organic material.

The transistor may be electrically connected to an organic light emitting element. The organic light emitting element may emit or may not emit light based on the transistor being turned-on or turned-off The organic light emitting element may be disposed on the via insulation layer 116a. The organic light emitting element may include a pixel electrode 117, an opposite electrode 119 opposite to the pixel electrode 117, and an intermediate layer 118 disposed between the pixel electrode 117 and the opposite electrode 119. The display device 100 may include a bottom emission type, a top emission type, and/or a dual emission type. The pixel electrode 117 and the opposite electrode 119 may be a transmission electrode and the reflective electrode, respectively, in the bottom emission type. The pixel electrode 117 and the opposite electrode 119 may be a reflective electrode and a transmission electrode, respectively, in the top emission type. Each of the pixel electrode 117 and the opposite electrode 119 may be a transmission electrode in the dual emission type. FIG. 4A illustrates a top emission type display device. However, an exemplary embodiment of the present disclosure may be applied to a bottom emission type display device or a dual emission type display device.

The pixel electrode 117 may be patterned as an island shape corresponding to each pixel. The pixel electrode 117 may be in contact with the transistor through a via hole formed in the via insulation layer 116a.

The pixel electrode 117 may include a reflective electrode layer along with a transparent electrode layer to reflect light to the opposite electrode 119. When the pixel electrode 117 functions as an anode, the transparent electrode layer may include a material having high work function such as indium tin oxide (ITO), indium zinc oxide (IZO), zinc oxide (ZnO), indium oxide ($In_2O_3$), indium gallium oxide (IGO), and/or aluminum zinc oxide (AZO). The reflective electrode layer may include a metal having high reflectance such as silver (Ag).

A pixel defining layer 116b may be disposed on the via insulation layer 116a. For example, the pixel defining layer 116b may be an organic layer including an organic material. The pixel defining layer 116b may cover an edge of the pixel electrode 117, and the pixel defining layer 116b may include an opening portion exposing a center portion of the pixel electrode 117. The opening portion may correspond to an emission area of the pixel, and the intermediate layer 118 may be disposed in the opening portion.

The intermediate layer 118 may include an organic light emitting layer emitting red, green, or blue light. The organic light emitting layer may be formed of a low molecular organic material or a high molecular organic material. When the organic light emitting layer is formed of the low molecular organic material, a hole transport layer (HTL) and a hole injection layer (HIL) may be disposed between the pixel electrode 117 and the organic light emitting layer, and an electron transport layer (ETL) and an electron injection layer (EIL) may be disposed between the organic light emitting layer and the opposite electrode 119.

The opposite electrode 119 may be disposed to correspond to an entirety of the pixel defining layer 116b. The opposite electrode 119 may be formed of a metal. When the opposite electrode 119 functions as a cathode, the opposite electrode 119 may include a material having low work function such as lithium (Li), calcium (Ca), LiF/Ca, LiF/Al, aluminum (Al), magnesium (Mg), silver (Ag), or the like. The opposite electrode 119 may have thin thickness to transmit light.

FIG. 4B may illustrate a display unit 110 according to another exemplary embodiment. Detailed explanations on elements of the display unit 110 according to another exemplary embodiment, which are substantially the same as or similar to elements of the display unit 110 according to an exemplary embodiment discussed above, will not be repeated.

A pixel circuit may be disposed on a buffer layer 111. The pixel circuit may include at least one transistor. FIG. 4B illustrates a top-gate type transistor including an active pattern 112, a gate electrode 114, first source/drain electrodes 115a and 115b, and second source/drain electrodes 115c and 115d. However, the pixel circuit may include various type transistors such as a bottom-gate type transistor or the like.

A passivation layer 113c may be disposed on the first source electrode 115a and the first drain electrode 115b. The passivation layer 113c may be an inorganic layer including an inorganic material such as silicon oxide, silicon nitride, or the like. The passivation layer 113c may insulate the second source/drain electrodes 115c and 115d from the first source/drain electrodes 115a and 115b.

A planarization layer 116c may be disposed on the passivation layer 113c. The planarization layer 116c may have a flat surface, and the planarization layer 116c may prevent defects of structures thereover due to an uneven surface thereunder. For example, the planarization layer 116c may be an organic layer including an organic material.

The second source electrode 115c and the second drain electrode 115d may be disposed on the planarization layer 116c. The second source electrode 115c and the second drain electrode 115d may be in contact with the first source electrode 115a and the first drain electrode 115b, respectively, through contact holes formed in the passivation layer 113c and the planarization layer 116c. For example, the second source electrode 115c and the second drain electrode 115d may include a metal such as molybdenum (Mo), aluminum (Al), copper (Cu), titanium (Ti), or the like.

A via insulation layer 116a may be disposed on the second source electrode 115c and the second drain electrode 115d, and the via insulation layer 116a may cover the transistor. The via insulation layer 116a may have a flat surface alleviating a stepped portion induced by an uneven surface thereunder, and the via insulation layer 116a may prevent defects of structures thereover due to the uneven surface thereunder. For example, the via insulation layer 116a may be an organic layer including an organic material.

Referring to FIGS. 1, 2, and 3 again, an encapsulation member 130 may be disposed on the first surface of the substrate 105 in order to cover the display unit 110. The encapsulation member 130 may protect the display unit 110 from moisture, oxygen, or the like. The encapsulation member 130 may include at least one inorganic layer and at least one organic layer. For example, the encapsulation layer 130 may include two inorganic layers, and one organic layer formed therebetween. The inorganic layer may include silicon oxide, silicon nitride, silicon oxynitride, aluminum oxide, titanium oxide, tantalum oxide, hafnium oxide, zinc oxide, or the like. The organic layer may include polyethylene terephthalate (PET), polyimide (PI), polycarbonate (PC), epoxy, polyethylene, polyacrylate, or the like.

A pad portion 120 may be disposed in the flat area FA that is disposed at another side of the bending area BA. The pad portion 120 may be disposed on the first surface of the substrate 105. The pad portion 120 may be connected to the display unit 110 via wirings. The pad portion 120 may transmit signals receiving from external devices to the display unit 110 through the wirings.

A protective film 140 may be disposed in the flat area FA. The protective film 140 may be disposed on a second surface opposite to the first surface of the substrate 105. For example, the protective film 140 may not be disposed in the bending area BA. The protective film 140 may protect the second surface of the substrate 105.

As illustrated in FIGS. 2 and 3, the bending area BA of the substrate 105 may be bent. In the display device 100, an area outside a display area in which the display unit 110 is disposed may be a non-display area. As the non-display area increases, a dead space of the display device 100 may increase. In comparison to the unbent bending area BA of the substrate 105 as illustrated in FIG. 1, a size of the non-display area may decrease when the bending area BA of the substrate 105 is bent as illustrated in FIG. 2. Therefore, a dead space of the display device 100 may decrease.

As described above, the bending area BA of the substrate 105 may be bent. Thus, stresses such as compressive stress and tensile stress may be applied to the bending area BA. Cracks may occur in the bending area BA due to the stresses. The cracks may occur at an end of the bending area BA, and the cracks may progress to a center portion of the bending area BA through a peripheral area of the bending area BA. A wiring may be formed in the center portion of the bending area BA, and the wiring may connect the display unit 110 and the pad portion 120. When the cracks occurring at the end propagate and progress to the center portion, the wiring may be damaged, thereby inducing defects in the display unit 110.

A stress neutralizing layer 150 may be disposed in the bending area BA. The stress neutralizing layer 150 may serve to neutralize a location of a neutral surface (or neutral plane) such that a tensile stress may not be applied to the wiring that connects the display unit 110 to the pad portion 120. If the tensile stress is applied to the wiring, cracks may occur at the wiring. In order to prevent the cracks, the stress neutralizing layer 150 may be disposed on the wiring, so that the tensile stress may not be applied to the wiring.

The bending area BA may be bent along a bending axis BX substantially parallel to the first direction as illustrated in FIG. 3. The bending area BA may include a first area BA1, a second area BA2, and a third area BA3. The first area BA1 may be disposed at the bending axis BX. When the bending area BA is symmetrically bent along the bending axis BX, the bending area BA may have a symmetrical shape with respect to the first area BA1. The first area BA1 may have a minimum radius of curvature in the bending area BA. The second area BA2 may be a boundary between the bending area BA and the flat area FA. The third area BA3 may be disposed between the first area BA1 and the second area BA2.

Figure 5:
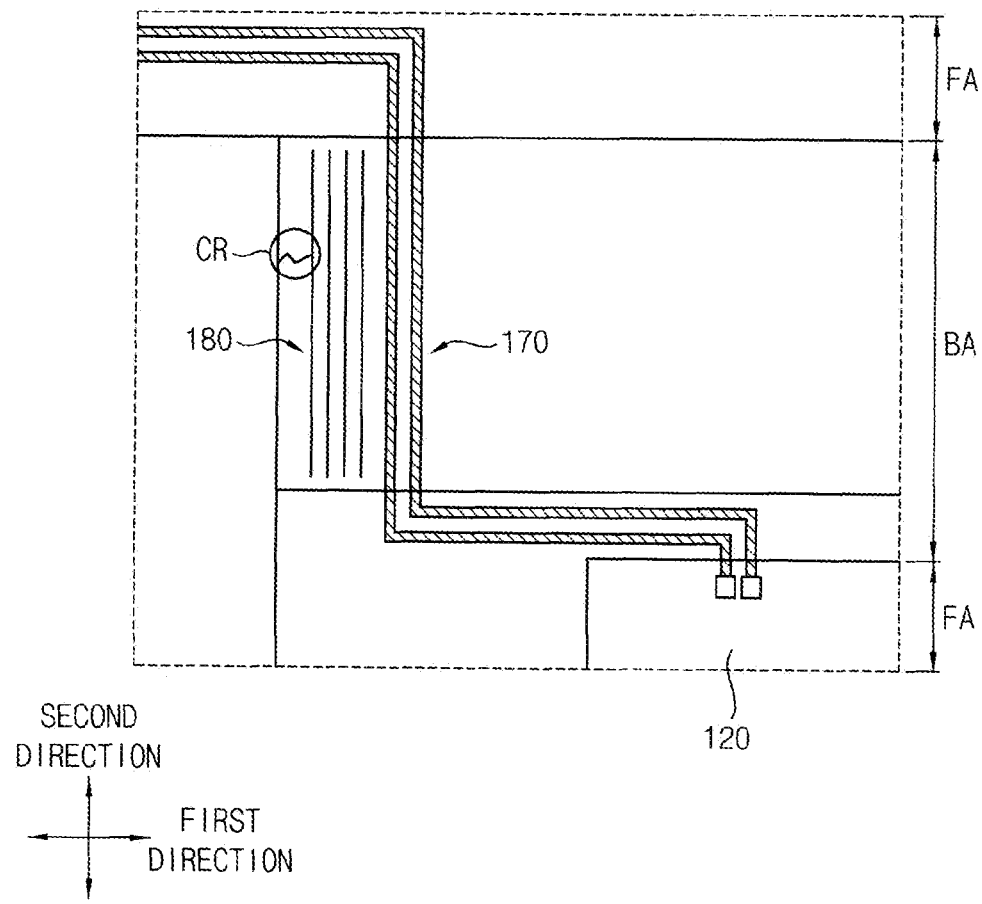
FIG. 5 is a plan view illustrating an example of a region V in FIG. 1.
Figure 6:
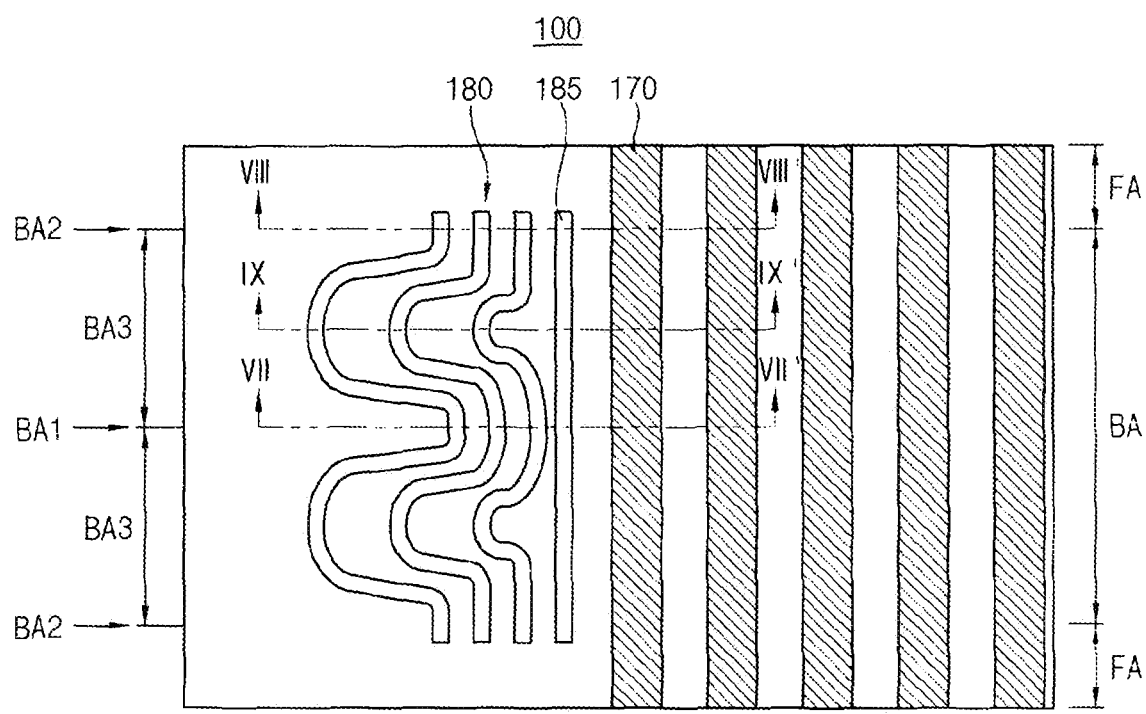
FIG. 6 is a plan view illustrating a bending area of a flexible display device according to an exemplary embodiment.
Figure 7:
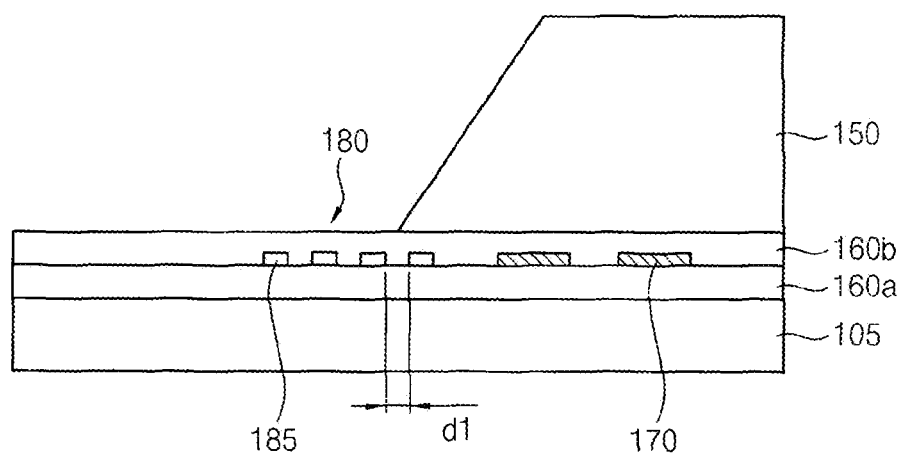
FIG. 7 is a cross-sectional view illustrating a first area in the bending area cut along a line VII-VII' in FIG. 6.
Figure 8:
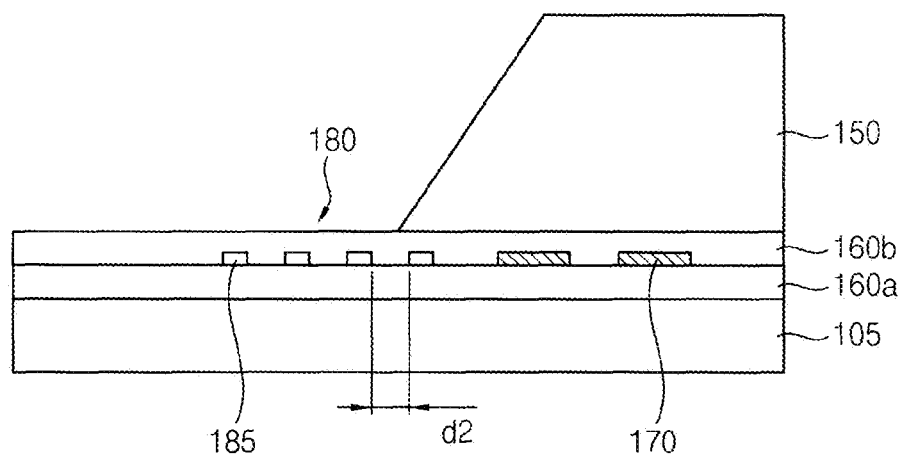
FIG. 8 is a cross-sectional view illustrating a second area in the bending area cut along a line VIII-VIII' in FIG. 6.
Figure 9:
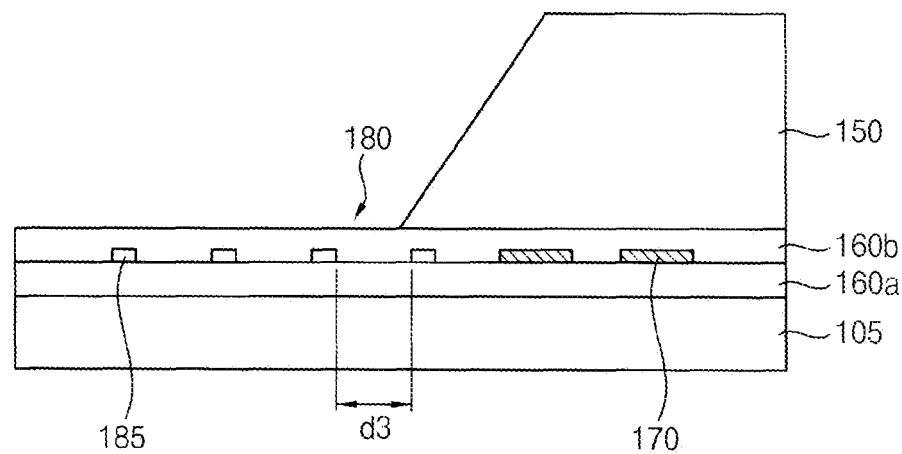
FIG. 9 is a cross-sectional view illustrating a third area in the bending area cut along a line IX-IX' in FIG. 6.

FIG. 5 is a plan view illustrating an example of a region V in FIG. 1. FIG. 6 is a plan view illustrating a bending area of a flexible display device according to an exemplary embodiment. FIG. 7 is a cross-sectional view illustrating a first area in the bending area cut along a line VII-VII' in FIG. 6. FIG. 8 is a cross-sectional view illustrating a second area in the bending area cut along a line VIII-VIII' in FIG. 6. FIG. 9 is a cross-sectional view illustrating a third area in the bending area cut along a line IX-IX' in FIG. 6.

Referring to FIGS. 5, 6, 7, 8, and 9, the flexible display device 100 according to an exemplary embodiment may include a crack prevention pattern 180.

A first insulation layer 160a may be disposed on the substrate 105 in the bending area BA. The first insulation layer 160a may be an organic layer including an organic material.

A wiring 170 may be disposed on the first insulation layer 160a. The wiring 170 may connect the display unit 110 and the pad portion 120 as described above. The wiring 170 may be disposed in the center portion of the bending area BA. For example, the wiring 170 may extend along the second direction in the bending area BA.

The wiring 170 may include a metal such as molybdenum (Mo), aluminum (Al), copper (Cu), titanium (Ti), or the like. In an exemplary embodiment, the wiring 170 may be substantially the same material as the gate electrode 114 or the source/drain electrodes 115a and 115b which are disposed in the display unit 110. In another exemplary embodiment, the wiring 170 may be substantially the same material as the first source/drain electrodes 115a and 115b or the second source/drain electrodes 115c and 115d which are disposed in the display unit 110.

A second insulation layer 160b may be disposed on the first insulation layer 160a in the bending area BA, and the second insulation layer 160b may cover the wiring 170. The second insulation layer 160b may be an organic layer including an organic material. In an exemplary embodiment, the second insulation layer 160b may be substantially the same material as the via insulation layer 116a and/or the pixel defining layer 116b which are disposed in the display unit 110.

As illustrated in FIG. 5, when the cracks CR occurring at the end of the bending area BA (e.g., a side portion of the first insulation layer 160a or the second insulation layer 160b) propagate and progress toward the center portion, the wiring 170 may be damaged thereby inducing defects in display unit 110. In order to prevent the damage of the wiring 170, the crack prevention pattern 180 may be disposed in the peripheral portion of the bending area BA. For example, the crack prevention pattern 180 may be disposed on substantially the same level as the wiring 170.

In an exemplary embodiment, the crack prevention pattern 180 may include a plurality of crack prevention lines 185. The crack prevention lines 185 may extend along the second direction. FIGS. 5 and 6 illustrate that the crack prevention pattern 180 includes four crack prevention lines 185. However, the number of the crack prevention lines 185 is not limited thereto. Each of the crack prevention lines 185 may serve as a type (or kind) of dam preventing a development of cracks CR occurring at the end of the bending area BA and progressing toward the center portion.

In an exemplary embodiment, the crack prevention pattern 180 may be selectively disposed in the bending area BA. The crack prevention pattern 180 may be formed in the bending area BA, and the crack prevention pattern 180 may not be connected to other components in the flat area FA. For example, each of the crack prevention lines 185 may have an island shape.

Cracks occurring in the bending area BA may have different sizes (e.g., lengths) per the locations of the cracks. In an exemplary embodiment, the cracks may have different lengths to each other in the first area BA1, the second area BA2, and the third area BA3. If the crack prevention pattern 180 is not existed, a length of the crack in the first area BA1 may be greater than a length of the crack in the second area BA2, and a length of the crack in the second area BA2 may be greater than a length of the crack in the third area BA3. For example, in a certain circumstance, the length of the crack in the first area BA1 may be about 16.3 μm, the length of the crack in the second area BA2 may be about 15.7 μm, and the length of the crack in the third area BA3 may be about 13.9 μm.

The length differences of the cracks may be attributed to differences between a stress applied to the first area BA1 that has a minimum radius of curvature, a stress applied to the second area BA2 which is caused by a stepped portion existed in the second area BA2, and a stress applied to the third area BA3. When the bending area BA is bent, a first stress may be applied to the first area BA1, a second stress may be applied to the second area BA2, and a third stress may be applied to the third area BA3. The first stress may be greater than the second stress, and the second stress may be greater than the third stress. Therefore, a structure or the like of the crack prevention pattern 180 disposed in the first area BA1, the second area BA2, and the third area BA3 may be adjusted based on the lengths of the cracks.

In an exemplary embodiment, a density of the crack prevention pattern 180 may be different to each other in the first area BA1, the second area BA2, and the third area BA3. The density of the crack prevention pattern 180 may mean a degree to which the crack prevention lines 185 are densely disposed. For example, the density of the crack prevention pattern 180 may be inversely proportional to a size of a region where the crack prevention lines 185 are disposed. For example, a distance between adjacent crack prevention lines 185 may be different to each other in the first area BA1, the second area BA2, and the third area BA3 as illustrated in FIG. 6. When the distance between adjacent crack prevention lines 185 is relatively small, the density of the crack prevention pattern 180 may be relatively large (i.e., the size of the region where the crack prevention lines 185 are disposed may be relatively small). When the distance between adjacent crack prevention lines 185 is relatively large, the density of the crack prevention pattern 180 may be relatively small (i.e., the size of the region where the crack prevention lines 185 are disposed may be relatively large).

In an exemplary embodiment, the density of the crack prevention pattern 180 in the first area BA1 may be greater than the density of the crack prevention pattern 180 in the third area BA3. In other words, the crack prevention lines 185 in the first area BA1 may be disposed more densely than the crack prevention lines 185 in the third area BA3. For example, a distance (d1) between adjacent crack prevention lines 185 in the first area BA1 may be less than a distance (d3) between adjacent crack prevention lines 185 in the third area BA3. As the density of the crack prevention pattern 180 increases, a degree of preventing the progress of the crack may increase. When the crack prevention pattern 180 is not existed, a size of the crack in the first area BA1 may be greater than a size of the crack in the third area BA3. Therefore, the density of the crack prevention pattern 180 in the first area BA1 may be formed larger than the density of the crack prevention pattern 180 in the third area BA3.

In an exemplary embodiment, the density of the crack prevention pattern 180 in the second area BA2 may be greater than the density of the crack prevention pattern 180 in the third area BA3. In other words, the crack prevention lines 185 in the second area BA2 may be disposed more densely than the crack prevention lines 185 in the third area BA3. For example, a distance (d2) between adjacent crack prevention lines 185 in the second area BA2 may be less than a distance (d3) between adjacent crack prevention lines 185 in the third area BA3. As the density of the crack prevention pattern 180 increases, a degree of preventing the progress of the crack may increase. When the crack prevention pattern 180 is not existed, a size of the crack in the second area BA2 may be greater than a size of the crack in the third area BA3. Therefore, the density of the crack prevention pattern 180 in the second area BA2 may be formed larger than the density of the crack prevention pattern 180 in the third area BA3.

In an exemplary embodiment, the density of the crack prevention pattern 180 in the first area BA1 may be greater than the density of the crack prevention pattern 180 in the second area BA2. In other words, the crack prevention lines 185 in the first area BA1 may be disposed more densely than the crack prevention lines 185 in the second area BA2. For example, a distance (d1) between adjacent crack prevention lines 185 in the first area BA1 may be less than a distance (d2) between adjacent crack prevention lines 185 in the second area BA2. As the density of the crack prevention pattern 180 increases, a degree of preventing the progress of the crack may increase. When the crack prevention pattern 180 is not existed, a size of the crack in the first area BA1 may be greater than a size of the crack in the second area BA2. Therefore, the density of the crack prevention pattern 180 in the first area BA1 may be formed larger than the density of the crack prevention pattern 180 in the second area BA2.

In an exemplary embodiment, the crack prevention pattern 180 may include a metal such as molybdenum (Mo), aluminum (Al), copper (Cu), titanium (Ti), or the like. For example, the crack prevention pattern 180 may be substantially the same material as the wiring 170.

In another exemplary embodiment, the crack prevention pattern 180 may include an inorganic material such as silicon oxide, silicon nitride, or the like. For example, the crack prevention pattern 180 may be substantially the same material as the gate insulation layer 113*a*, the insulation interlayer 113*b*, or the passivation layer 113*c*.

The stress neutralizing layer 150 may be disposed on the second insulation layer 160*b*. The stress neutralizing layer 150 may be disposed in the center portion of the bending area BA to correspond to the wiring 170. The stress neutralizing layer 150 may include polyethylene terephthalate (PET), polyimide (PI), polycarbonate (PC), epoxy, polyethylene, polyacrylate, or the like. In an exemplary embodiment, the stress neutralizing layer 150 may include substantially the same material as the organic layer of the encapsulation member 130.

Figure 10:
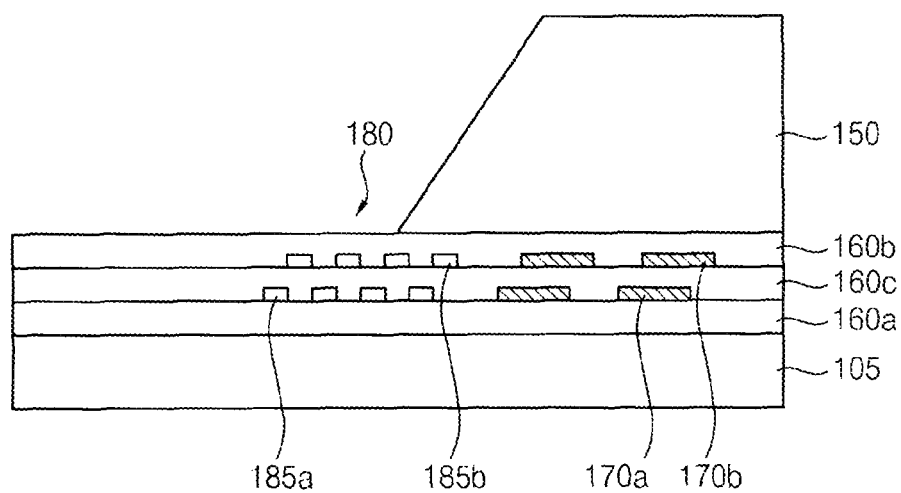
FIG. 10 is a cross-sectional view illustrating a first area in the bending area cut along a line VII-VII' in FIG. 6.

FIG. 10 is a cross-sectional view illustrating a first area in the bending area cut along a line VII-VII' in FIG. 6.

Referring to FIGS. 5, 6, and 10, the flexible display device 100 according to an exemplary embodiment may include a crack prevention pattern 180. Detailed explanations on elements with reference to FIG. 10, which are substantially the same as or similar to elements with reference to FIG. 7, will not be repeated.

A third insulation layer 160*c* may be disposed between the first insulation layer 160*a* and the second insulation layer 160*b* in the bending area BA. The third insulation layer 160*c* may be an organic layer including an organic material. In an exemplary embodiment, the third insulation layer 160*c* may include substantially the same material as the planarization layer 116*c* in the display unit 110.

A wiring 170 may be disposed on the first insulation layer 160*a* and the third insulation layer 160*c*. Specifically, the wiring 170 may include a first wiring 170*a* disposed on the first insulation layer 160*a* and a second wiring 170*b* disposed on the third insulation layer 160*c*. As described above, the wiring 170 may connect the display unit 110 and the pad portion 120. The wiring 170 may be disposed in the center portion of the bending area BA. For example, the wiring 170 may extend along the second direction in the bending area BA.

The wiring 170 may include a metal such as molybdenum (Mo), aluminum (Al), copper (Cu), titanium (Ti), or the like. In an exemplary embodiment, the first wiring 170*a* may include substantially the same material as the first source/drain electrodes 115*a* and 115*b* in the display unit 110. The second wiring 170*b* may include substantially the same material as the second source/drain electrodes 115*c* and 115*d* in the display unit 110.

As illustrated in FIG. 5, when cracks CR occurring at the end of the bending area BA (e.g., a side portion of the first insulation layer 160*a*, the second insulation layer 160*b*, or the third insulation layer 160*c*) propagate and progress toward the center portion, the wiring 170 may be damaged thereby inducing defects in display unit 110. In order to prevent the damage of the wiring 170, a crack prevention pattern 180 including a crack prevention line 185 may be disposed in the peripheral portion of the bending area BA. Specifically, the crack prevention line 185 may include a first crack prevention line 185*a* disposed on the first insulation layer 160*a* and a second crack prevention line 185*b* disposed on the third insulation layer 160*c*.

In an exemplary embodiment, the crack prevention pattern 180 may be disposed at substantially the same level as the wiring 170. For example, the first crack prevention line 185*a* may be disposed at substantially the same level as the first wiring 170*a*. The second crack prevention line 185*b* may be disposed at substantially the same level as the second wiring 170*b*.

In an exemplary embodiment, the crack prevention pattern 180 may include a metal such as molybdenum (Mo), aluminum (Al), copper (Cu), titanium (Ti), or the like. For example, the first crack prevention line 185*a* may include substantially the same material as the first wiring 170*a*. The second crack prevention line 185*b* may include substantially the same material as the second wiring 170*b*.

Figure 11:
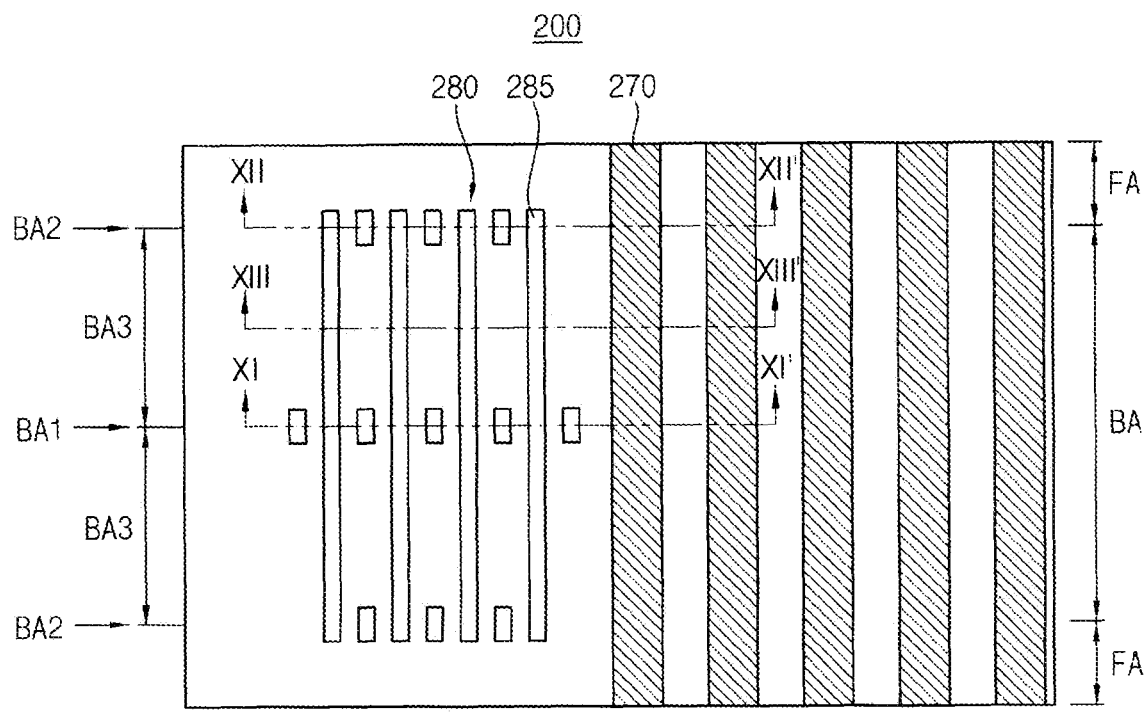
FIG. 11 is a plan view illustrating a bending area of a flexible display device according to an exemplary embodiment.
Figure 12:
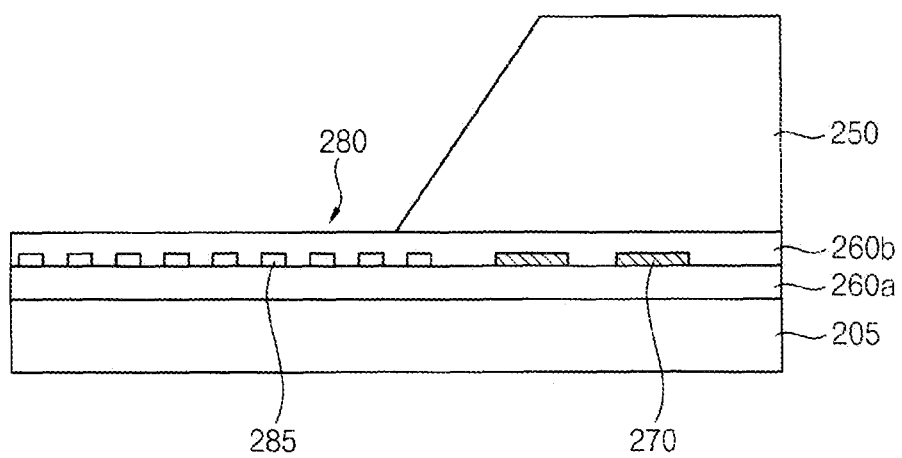
FIG. 12 is a cross-sectional view illustrating a first area in the bending area cut along a line XI-XI' in FIG. 11.
Figure 13:
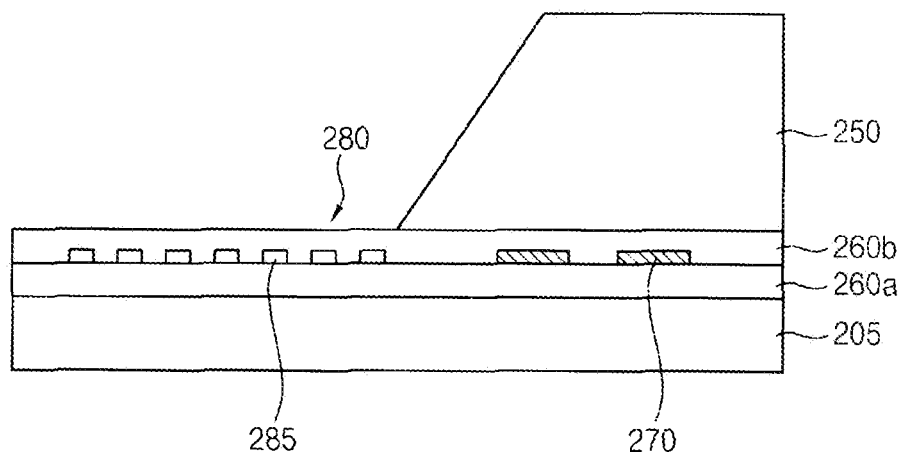
FIG. 13 is a cross-sectional view illustrating a second area in the bending area cut along a line XII-XII' in FIG. 11.
Figure 14:
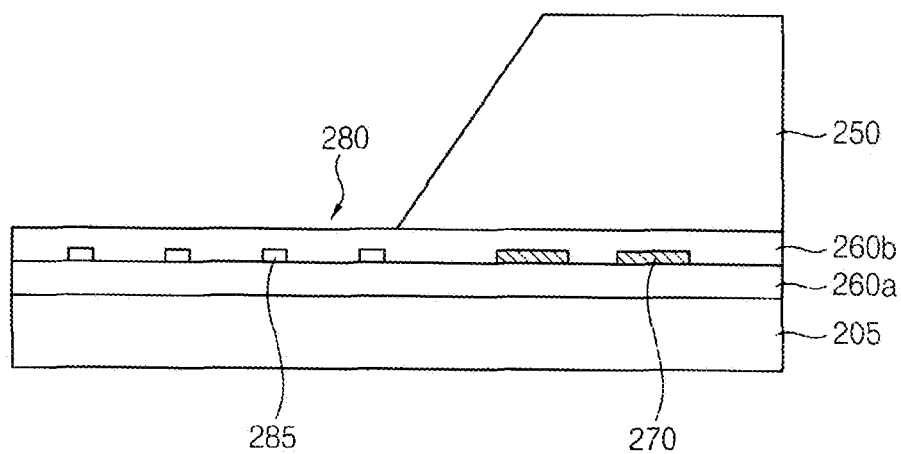
FIG. 14 is a cross-sectional view illustrating a third area in the bending area cut along a line XIII-XIII' in FIG. 11.

FIG. 11 is a plan view illustrating a bending area of a flexible display device according to an exemplary embodiment. FIG. 12 is a cross-sectional view illustrating a first area in the bending area cut along a line XI-XI' in FIG. 11. FIG. 13 is a cross-sectional view illustrating a second area in the bending area cut along a line XII-XII' in FIG. 11. FIG. 14 is a cross-sectional view illustrating a third area in the bending area cut along a line XIII-XIII' in FIG. 11.

Referring to FIGS. 5, 11, 12, 13, and 14, a flexible display device 200 according to an exemplary embodiment may include a crack prevention pattern 280 having different number of crack prevention lines 285 in the first area BA1, the second area BA2, and the third area BA3.

A first insulation layer 260*a* may be disposed on the substrate 205. The first insulation layer 260*a* may be an organic layer including an organic material.

A wiring 270 may be disposed on the first insulation layer 260*a*. The wiring 270 may connect the display unit 110 and the pad portion 120 as described above. The wiring 270 may be disposed in the center portion of the bending area BA. For example, the wiring 270 may extend along the second direction in the bending area BA.

The wiring 270 may include a metal such as molybdenum (Mo), aluminum (Al), copper (Cu), titanium (Ti), or the like. In an exemplary embodiment, the wiring 270 may be substantially the same material as the gate electrode 114 or the source/drain electrodes 115*a* and 115*b* which are disposed in the display unit 110. In another exemplary embodiment, the wiring 270 may be substantially the same material as the first source/drain electrodes 115*a* and 115*b* or the second source/drain electrodes 115*c* and 115*d* which are disposed in the display unit 110.

A second insulation layer 260*b* may be disposed on the first insulation layer 260*a* in the bending area BA, and may cover the wiring 270. The second insulation layer 260*b* may be an organic layer including an organic material. In an exemplary embodiment, the second insulation layer 260*b* may be substantially the same material as the via insulation layer 116*a* and/or the pixel defining layer 116*b* which are disposed in the display unit 110.

As illustrated in FIG. 5, when cracks CR occurring at the end of the bending area BA (e.g., a side portion of the first insulation layer 260*a* or the second insulation layer 260*b*) propagate and progress toward the center portion, the wiring 270 may be damaged thereby inducing defects in display unit 110. In order to prevent the damage of the wiring 270, the crack prevention pattern 280 may be disposed in the peripheral portion of the bending area BA. For example, the crack prevention pattern 280 may be disposed on substantially the same level as the wiring 270.

In an exemplary embodiment, the crack prevention pattern 280 may include a plurality of crack prevention lines 285. The crack prevention lines 285 may extend along the second direction. Each of the crack prevention lines 285 may serve as a type (or kind) of dam preventing a development of cracks CR occurring at the end of the bending area BA and progressing toward the center portion.

In an exemplary embodiment, the crack prevention pattern 280 may be selectively disposed in the bending area BA. The crack prevention pattern 280 may be formed in the bending area BA, and may not be connected to other components in the flat area FA. For example, each of the crack prevention lines 285 may have an island shape.

Cracks occurring in the bending area BA may have different sizes (e.g., lengths) per the locations of the cracks. In an exemplary embodiment, the cracks may have different lengths to each other in the first area BA1, the second area BA2, and the third area BA3. If the crack prevention pattern 280 is not existed, a length of the crack in the first area BA1 may be greater than a length of the crack in the second area BA2, and a length of the crack in the second area BA2 may be greater than a length of the crack in the third area BA3.

The length differences of the cracks may be attributed to differences between a stress applied to the first area BA1 that has a minimum radius of curvature, a stress applied to the second area BA2 which is caused by a stepped portion existed in the second area BA2, and a stress applied to the third area BA3. When the bending area BA is bent, a first stress may be applied to the first area BA1, a second stress may be applied to the second area BA2, and a third stress may be applied to the third area BA3. The first stress may be greater than the second stress, and the second stress may be greater than the third stress. Therefore, a structure, or the like of the crack prevention pattern 280 disposed in the first area BA1, the second area BA2, and the third area BA3 may be adjusted based on the lengths of the cracks.

In an exemplary embodiment, the number of the crack prevention lines 285 may be different to each other in the first area BA1, the second area BA2, and the third area BA3. For example, the number of the crack prevention lines 285 disposed in the first area BA1, the second area BA2, and the third area BA3 may be different to each other as illustrated in FIG. 11. When the number of the crack prevention lines 285 is relatively large, the density of the crack prevention pattern 280 may be relatively large. When the number of the crack prevention lines 285 is relatively small, the density of the crack prevention pattern 280 may be relatively small.

In an exemplary embodiment, the number of the crack prevention lines 285 in the first area BA1 may be greater than the number of the crack prevention lines 285 in the third area BA3. For example, the crack prevention pattern 280 may have 9 crack prevention lines 285 in the first area BA1, and may have 4 crack prevention lines 285 in the third area BA3. However, the number of the crack prevention lines 285 is not limited thereto. As the number of the crack prevention lines 285 increases, a degree of preventing the progress of the crack may increase. As described above, when the crack prevention pattern 280 does not exist, a size of the crack in the first area BA1 may be greater than a size of the crack in the third area BA3. Therefore, the number of the crack prevention lines 285 in the first area BA1 may be greater than the number of the crack prevention lines 285 in the third area BA3.

In an exemplary embodiment, the number of the crack prevention lines 285 in the second area BA2 may be greater than the number of the crack prevention lines 285 in the third area BA3. For example, the crack prevention pattern 280 may have 7 crack prevention lines 285 in the second area BA2, and may have 4 crack prevention lines 285 in the third area BA3. However, the number of the crack prevention lines 285 is not limited thereto. As the number of the crack prevention lines 285 increases, a degree of preventing the progress of the crack may increase. As described above, when the crack prevention pattern 280 does not exist, a size of the crack in the second area BA2 may be greater than a size of the crack in the third area BA3. Therefore, the number of the crack prevention lines 285 in the second area BA2 may be greater than the number of the crack prevention lines 285 in the third area BA3.

In an exemplary embodiment, the number of the crack prevention lines 285 in the first area BA1 may be greater than the number of the crack prevention lines 285 in the second area BA2. For example, the crack prevention pattern 280 may have 9 crack prevention lines 285 in the first area BA1, and may have 7 crack prevention lines 285 in the second area BA2. However, the number of the crack prevention lines 285 is not limited thereto. As the number of the crack prevention lines 285 increases, a degree of preventing the progress of the crack may increase. As described above, when the crack prevention pattern 280 does not exist, a size of the crack in the first area BA1 may be greater than a size of the crack in the second area BA2. Therefore, the number of the crack prevention lines 285 in the first area BA1 may be greater than the number of the crack prevention lines 285 in the second area BA2.

In an exemplary embodiment, the crack prevention pattern 280 may include a metal such as molybdenum (Mo), aluminum (Al), copper (Cu), titanium (Ti), or the like. For example, the crack prevention pattern 280 may be substantially the same material as the wiring 270.

In another exemplary embodiment, the crack prevention pattern 280 may include an inorganic material such as silicon oxide, silicon nitride, or the like. For example, the crack prevention pattern 280 may be substantially the same material as the gate insulation layer 113a, the insulation interlayer 113b, or the passivation layer 113c which are disposed in the display unit 110.

The stress neutralizing layer 250 may be disposed on the second insulation layer 260b. The stress neutralizing layer 250 may be disposed in the center portion of the bending area BA to correspond to the wiring 270. The stress neutralizing layer 250 may include polyethylene terephthalate (PET), polyimide (PI), polycarbonate (PC), epoxy, polyethylene, polyacrylate, or the like. In an exemplary embodiment, the stress neutralizing layer 250 may include substantially the same material as the organic layer of the encapsulation member 130.

Figure 15:
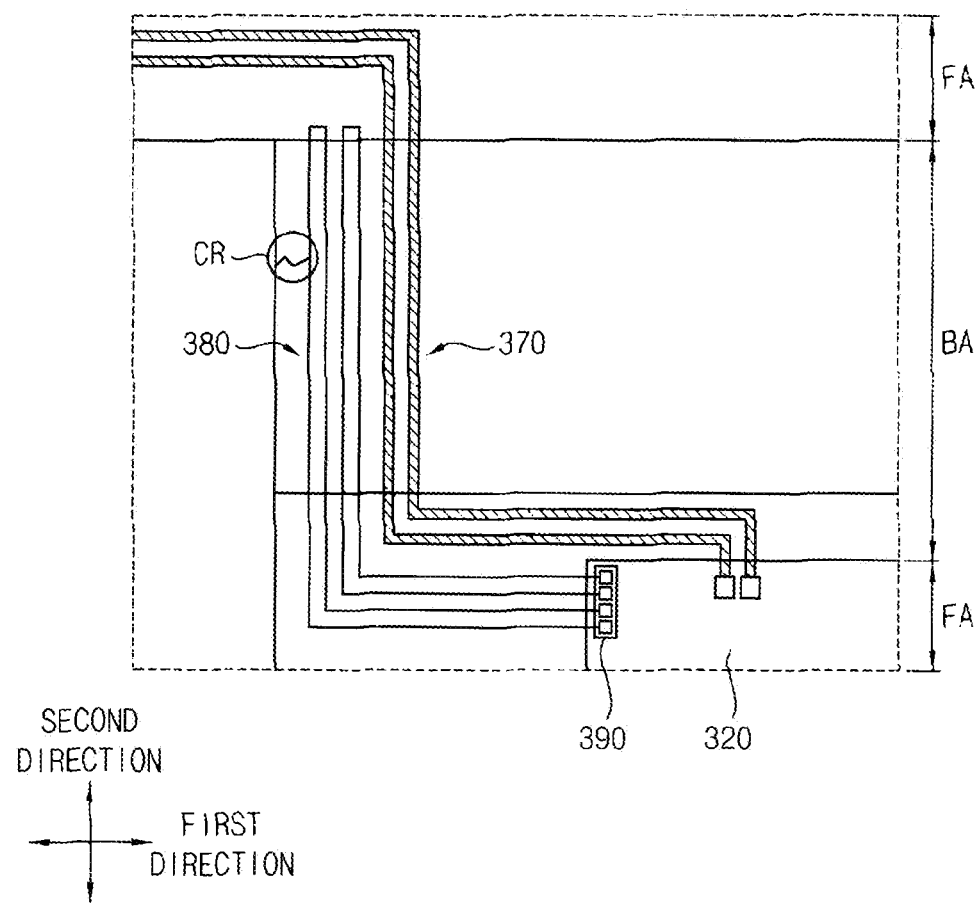
FIG. 15 is a plan view illustrating an example of a region V in FIG. 1.
Figure 16:
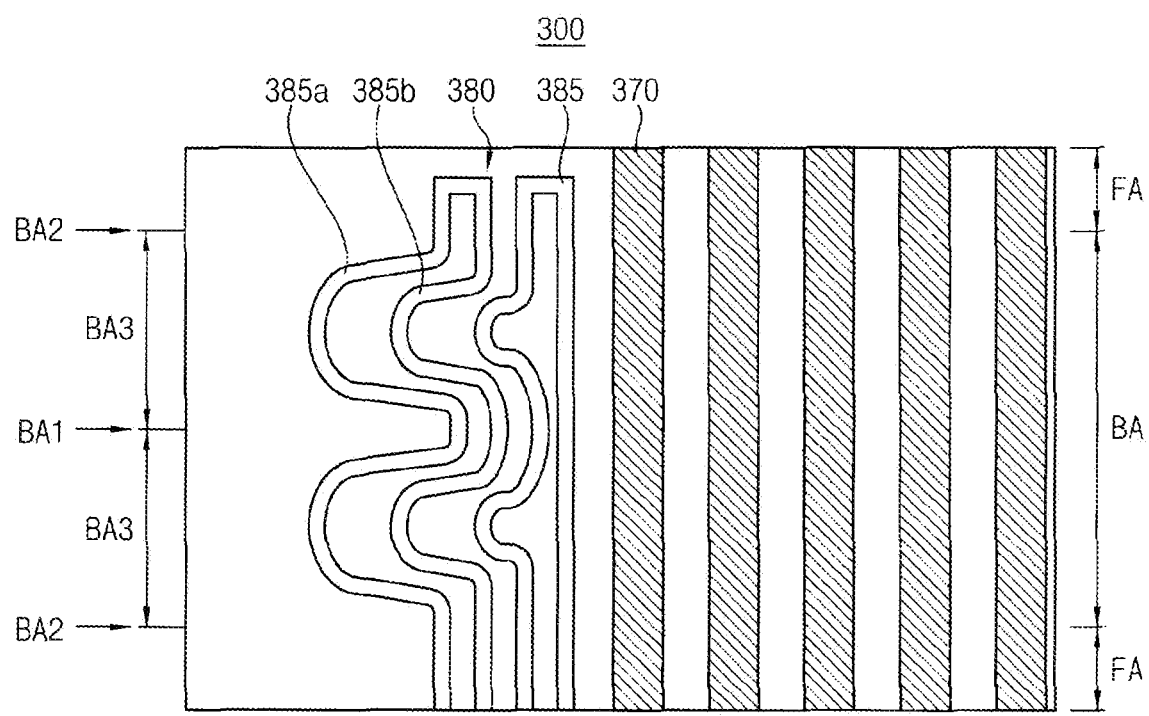
FIG. 16 is a plan view illustrating a bending area of a flexible display device according to an exemplary embodiment.

FIG. 15 is a plan view illustrating an example of a region V in FIG. 1. FIG. 16 is a plan view illustrating a bending area of a flexible display device according to an exemplary embodiment.

Referring to FIGS. 15 and 16, a flexible display device 300 according to an exemplary embodiment may include a crack prevention pattern 380 having different densities to each other in the first area BA1, the second area BA2, and the third area BA3. Detailed explanations on elements of the flexible display device 300 according to an exemplary embodiment, which are substantially the same as or similar to elements of the flexible display device 100 according to an exemplary embodiment above, will not be repeated.

As illustrated in FIG. 15, when cracks CR occurring at the end of the bending area BA propagate and progress toward the center portion, a wiring 370 may be damaged thereby inducing defects in the display unit 110. In order to prevent the damage of the wiring 370, the crack prevention pattern 380 may be disposed in the peripheral portion of the bending area BA. For example, the crack prevention pattern 380 may be disposed on substantially the same level as the wiring 370.

In an exemplary embodiment, the crack prevention pattern 380 may include a plurality of crack prevention lines 385. The crack prevention lines 385 may extend along the second direction. Each of the crack prevention lines 385 may serve as a type (or kind) of dam preventing a development of cracks CR occurring at the end of the bending area BA and progressing toward the center portion.

In an exemplary embodiment, the crack prevention pattern 380 may extend to a crack sensing portion 390 disposed in the flat area FA. The crack sensing portion 390 may detect cracks. FIG. 15 illustrates that the crack sensing portion 390 is disposed in the pad portion 320. However, a location of the crack sensing portion 390 is not limited thereto, and the crack sensing portion 390 may be disposed outside the pad portion 320. For example, one end of a first crack prevention line 385a and one end of a second crack prevention line 385b may be connected to each other. Another end of the first crack prevention line 385a and another end of the second crack prevention line 385b may be connected to the crack sensing portion 390. For example, the first crack prevention line 385a and the second crack prevention line 385b may have a loop shape.

The crack sensing portion 390 may provide an input signal through the first crack prevention line 385a. The crack sensing portion 390 may receive an output signal corresponding to the input signal through the second crack prevention line 385b. The crack sensing portion 390 may detect a crack of the crack prevention pattern 380 by comparing the input signal and the output signal. For example, the crack sensing portion 390 may include a logic circuit for measuring a resistance of the crack prevention pattern 380 by comparing a voltage value of the input signal with a voltage value of the output signal. The crack sensing portion 390 may detect the crack of the crack prevention pattern 380 by sensing a change in the resistance value of the crack prevention pattern 380. The crack prevention pattern 380 may prevent cracks from progressing in the bending area BA, and may detect an occurrence of cracks in the bending area BA.

Figure 17:
FIGS. 17 and 18 are cross-sectional views illustrating a method of manufacturing a flexible display device according to an exemplary embodiment.
Figure 18:
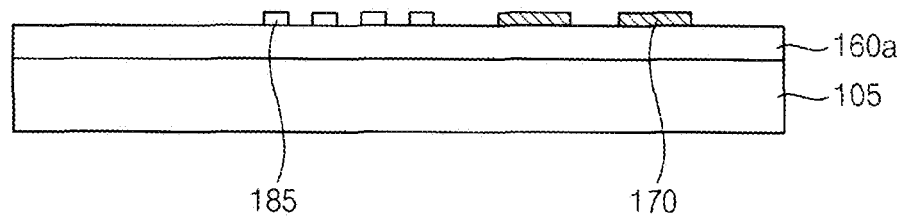

FIGS. 17 and 18 are cross-sectional views illustrating a method of manufacturing a flexible display device according to an exemplary embodiment.

Referring to FIGS. 6 and 17, the substrate 105 including the flat area FA and the bending area BA may be prepared. The first insulation layer 160a may be formed on the substrate 105 in the bending area BA. The bending area BA may include the first area BA1 having a minimum radius of curvature in the bending area BA, a second area BA2 disposed at a boundary between the bending area BA and the flat area FA, and a third area BA3 disposed between the first area BA1 and the second area BA2. The substrate 105 may be formed of a plastic (e.g., polyimide (PI), polyethylene naphthalate (PEN), polyethylene terephthalate (PET), polyether ether ketone (PEEK), polyethersulfone (PES), polymethyl methacrylate (PMMA), polycarbonate (PC), and polypropylene (PP)), a thin glass, a thin metal, or the like.

The first insulation layer 160a may be formed on the substrate 105 by applying an organic material such as polyimide, epoxy based resin, polyesters, or the like. In an exemplary embodiment, a first inorganic layer, a second inorganic layer, and a third inorganic layer may be sequentially formed on the substrate 105 in the flat area FA and the bending area BA. Then, the first inorganic layer, the second inorganic layer, and the third inorganic layer in the bending area BA may be removed to form the buffer layer 111, the gate insulation layer 113a, and the insulation interlayer 113b which are illustrated in FIG. 4A. Then, an organic material may be applied on the substrate 105 in the bending area BA to form the first insulation layer 160a. The first insulation layer 160a may alleviate a stepped portion generated by removing the first to third inorganic layers. The first insulation layer 160a may improve flexible characteristics of the bending area BA.

Referring to FIGS. 6 and 18, the wiring 170 and the crack prevention pattern 180 may be formed on the first insulation layer 160a in the bending area BA. The crack prevention pattern 180 may be formed in the peripheral portion of the bending area BA. The wiring 170 may be formed in the center portion of the bending area BA located inside the peripheral portion.

In exemplary embodiments, the crack prevention pattern 180 and the wiring 170 may be substantially simultaneously formed. For example, a metal layer may be formed on the first insulation layer 160a. Then, the metal layer may be etched using e.g., a photoresist process to substantially simultaneously form the crack prevention pattern 180 and the wiring 170. In one exemplary embodiment, the crack prevention pattern 180 and the wiring 170 may be substantially simultaneously formed with the source/drain electrodes 115a and 115b (illustrated in FIG. 4A) disposed in the display unit 110. In another exemplary embodiment, the crack prevention pattern 180 and the wiring 170 may be substantially simultaneously formed with the first source/drain electrodes 115a and 115b or the second source/drain electrodes 115c and 115d (illustrated in FIG. 4B) disposed in the display unit 110.

In some exemplary embodiments, the crack prevention pattern 180 may be substantially simultaneously formed with an inorganic insulation layer such as the passivation layer 113c (illustrated in FIG. 4B) disposed in the display unit 110. For example, a fourth inorganic layer may be formed on the insulation interlayer 113b in the flat area FA and the first insulation layer 160a in the bending area BA. Then, the fourth inorganic layer may be etched using e.g., a photoresist process to substantially simultaneously form the crack prevention pattern 180 and the passivation layer 113c. In one exemplary embodiment, the wiring 170 may be substantially simultaneously formed with the first source/drain electrodes 115a and 115b disposed in the display unit 110 before forming the crack prevention pattern 180. In another exemplary embodiment, the wiring 170 may be substantially simultaneously formed with the second source/drain electrodes 115c and 115d disposed in the display unit 110 after forming the crack prevention pattern 180.

Referring to FIG. 7, the second insulation layer 160b may be formed on the first insulation layer 160a in the bending area BA so as to cover the wiring 170 and the crack prevention pattern 180. The stress neutralizing layer 150 may be formed on the second insulation layer 160b. The second insulation layer 160b may be formed on the first insulation layer 160a by applying an organic material such as polyimide, epoxy based resin, polyesters, or the like. In an exemplary embodiment, the second insulation layer 160b may be substantially simultaneously formed with the via insulation layer 116a and/or the pixel defining layer 116b (illustrated in FIG. 4A) disposed in the display unit 110. The stress neutralizing layer 150 may be formed on the second insulation layer 160b by applying an organic material such as polyethylene terephthalate (PET), polyimide (PI), polycarbonate (PC), epoxy, polyethylene, polyacrylate, or the like. In an exemplary embodiment, the stress neutralizing layer 150 may be substantially simultaneously formed with the organic layer of the encapsulation member 130 (illustrated in FIG. 3).

As described above, according to the method of manufacturing the flexible display device according to an exemplary embodiment, the crack preventing pattern 180 may be substantially simultaneously formed with the wiring 170 or the inorganic insulation layer such as the passivation layer 113c. Therefore, additional processes to form the crack prevention pattern 180 may not be necessary.

Figure 19:
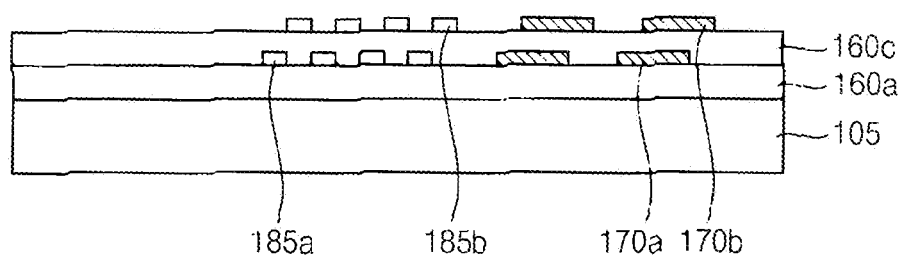
FIG. 19 is a cross-sectional view illustrating a method of manufacturing a flexible display device according to an exemplary embodiment.

FIG. 19 is a cross-sectional view illustrating a method of manufacturing a flexible display device according to an exemplary embodiment.

Referring to FIGS. 6 and 19, the substrate 105 including the flat area FA and the bending area BA may be prepared. The first insulation layer 160a may be formed on the substrate 105 in the bending area BA. The bending area BA may include the first area BA1 having a minimum radius of curvature, a second area BA2 disposed at a boundary between the bending area BA and the flat area FA, and a third area BA3 disposed between the first area BA1 and the second area BA2. The substrate 105 may be formed of a plastic (e.g., polyimide (PI), polyethylene naphthalate (PEN), polyethylene terephthalate (PET), polyether ether ketone (PEEK), polyethersulfone (PES), polymethyl methacrylate (PMMA), polycarbonate (PC), and polypropylene (PP)), a thin glass, a thin metal, or the like. The first insulation layer 160a may be formed on the substrate 105 by applying an organic material such as polyimide, epoxy based resin, polyesters, or the like.

In exemplary embodiments, the crack prevention pattern 180 and the wiring 170 may be substantially simultaneously formed. For example, a first metal layer may be formed on the first insulation layer 160a. Then, the first metal layer may be etched using e.g., a photoresist process to substantially simultaneously form the first crack prevention line 185a and the first wiring 170a. Then, the third insulation layer 160c may be formed on the first insulation layer 160a so as to cover the first crack prevention line 185a and the first wiring 170a. A second metal layer may be formed on the third insulation layer 160c. Then, the second metal layer may be etched using e.g., a photoresist process to substantially simultaneously form the second crack prevention line 185b and the second wiring 170b. The third insulation layer 160c may be substantially simultaneously formed with the planarization layer 116c (illustrated in FIG. 4B) disposed in the display unit 110. For example, the first crack prevention line 185a and the first wiring 170a may be substantially simultaneously formed with the first source/drain electrodes 115a and 115b (illustrated in FIG. 4B) disposed in the display unit 110. The second crack prevention line 185b and the second wiring 170b may be substantially simultaneously formed with the second source/drain electrodes 115c and 115d (illustrated in FIG. 4B) disposed in the display unit 110.

Referring to FIG. 10, the second insulation layer 160b may be formed on the third insulation layer 160c in the bending area BA so as to cover the wiring 170 and the crack prevention pattern 180. The stress neutralizing layer 150 may be formed on the second insulation layer 160b. The second insulation layer 160b may be formed on the third insulation layer 160c by applying an organic material such as polyimide, epoxy based resin, polyesters, or the like. In an exemplary embodiment, the second insulation layer 160b may be substantially simultaneously formed with the via insulation layer 116a and/or the pixel defining layer 116b (illustrated in FIG. 4A) disposed in the display unit 110. The stress neutralizing layer 150 may be formed on the second insulation layer 160b by applying an organic material such as polyethylene terephthalate (PET), polyimide (PI), polycarbonate (PC), epoxy, polyethylene, polyacrylate, or the like. In an exemplary embodiment, the stress neutralizing layer 150 may be substantially simultaneously formed with the organic layer of the encapsulation member 130 (illustrated in FIG. 3).

As described above, according to the method of manufacturing the flexible display device according to an exemplary embodiment, the crack preventing pattern 180 may be substantially simultaneously formed with the wiring 170. Therefore, additional processes to form the crack prevention pattern 180 may not be necessary.

The flexible display device according to exemplary embodiments of the present disclosure may be applied to a display device included in a computer, a notebook, a mobile phone, a smartphone, a smart pad, a PMP, a PDA, an MP3 player, or the like.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A flexible display device, comprising:
a substrate comprising a non-bending area and a bending area adjacent to the non- bending area, the bending area further comprising a first area having a first stress when bending, a second area having a second stress when bending, the second stress being less than the first stress, and a third area having a third stress when bending, the third stress being less than the second stress; and
a crack prevention pattern disposed in the bending area, wherein the crack prevention pattern further comprises a plurality of crack prevention lines,
wherein a number of the plurality of crack prevention lines from a cross-sectional view along a bending direction in the first area is greater than a number of the plurality of crack prevention lines from a cross-sectional view along the bending direction in the third area.

2. The flexible display device of claim 1, wherein a number of the plurality of crack prevention lines in the second area is greater than the number of the plurality of crack prevention lines in the third area.

3. The flexible display device of claim 1, wherein the number of the plurality of crack prevention lines in the first area is greater than a number of the plurality of crack prevention lines in the second area.

4. The flexible display device of claim 1, wherein the first area has a minimum radius of curvature in the bending area,
wherein the second area is a boundary between the non-bending area and the bending area, and
wherein the third area is disposed between the first area and the second area.

5. The flexible display device of claim 1, wherein the crack prevention pattern further comprises a metal.

6. The flexible display device of claim 1, wherein the crack prevention pattern further comprises an inorganic material.

7. The flexible display device of claim 1, wherein the crack prevention pattern is disposed only in the bending area.

8. The flexible display device of claim 1, wherein the crack prevention pattern extends from the bending area to a crack sensing portion disposed in the non-bending area, and
wherein the crack sensing portion senses a crack of the crack prevention pattern.

9. The flexible display device of claim 1, further comprising a wiring disposed in a center portion of the bending area,
wherein the crack prevention pattern is disposed in a peripheral portion of the bending area outside the center portion.

10. The flexible display device of claim 9, wherein the wiring and the crack prevention pattern are disposed on a same level comparing to the substrate and the wiring further comprises a same material as the crack prevention pattern.

11. A flexible display device, comprising:
a substrate comprising a non-bending area and a bending area adjacent to the non-bending area, the bending area further comprising a bending axis and an adjacent area adjacent to the bending axis; and a crack prevention pattern disposed in the bending area, the crack prevention pattern further comprising a plurality of crack prevention lines,
wherein a distance between the plurality of crack prevention lines along a direction of the bending axis in the bending axis is less than a distance between the plurality of crack prevention lines in the adjacent area.

12. The flexible display device of claim 11, wherein a distance between the plurality of crack prevention lines at a boundary between the non-bending area and the bending area is less than the distance between the plurality of crack prevention lines in the adjacent area, and the distance between the plurality of crack prevention lines at a boundary between the non-bending area and the bending area is greater than the distance between the plurality of crack prevention lines in the bending axis.

13. The flexible display device of claim 11, further comprising:
a first organic insulation layer disposed on the substrate in the bending area; and
a second organic insulation layer disposed on the first organic insulation layer,
wherein the crack prevention pattern is disposed between the first organic insulation layer and the second organic insulation layer.

14. The flexible display device of claim 11, further comprising:
a first organic insulation layer disposed on the substrate in the bending area;
a second organic insulation layer disposed on the first organic insulation layer; and
a third organic insulation layer disposed on the second organic insulation layer,
wherein the plurality of crack prevention lines further comprise:
a plurality of first crack prevention lines disposed between the first organic insulation layer and the second organic insulation layer; and
a plurality of second crack prevention lines disposed between the second organic insulation layer and the third organic insulation layer.

15. A method of manufacturing a flexible display device, comprising:
preparing a substrate comprising a non-bending area and a bending area adjacent to the non-bending area, the bending area further comprising a first area having a first stress when bending, a second area having a second stress, the second stress being less than the first stress when bending, and a third area having a third stress, the third stress being less than the second stress when bending; and
forming a crack prevention pattern on the substrate in a peripheral portion of the bending area, wherein the crack prevention pattern further comprises a plurality of crack prevention lines,
wherein a number of the plurality of crack prevention lines from a cross-sectional view along a bending direction in the first area is greater than a number of the plurality of crack prevention lines from a cross-sectional view along the bending direction in the third area.

16. The method of claim 15, wherein a number of the plurality of crack prevention lines in the second area is greater than the number of the plurality of crack prevention lines in the third area.

17. The method of claim 15, wherein the number of the plurality of crack prevention lines in the first area is greater than a number of the plurality of crack prevention lines in the second area.

18. The method of claim 15, further comprising:
forming a first organic insulation layer on the substrate in the bending area before the forming the crack prevention pattern; and
forming a second organic insulation layer on the first organic insulation layer to cover the crack prevention pattern after the forming the crack prevention pattern.

19. The method of claim 15, further comprising forming a wiring in a center portion inside the peripheral portion of the bending area,
wherein the crack prevention pattern and the wiring are simultaneously formed.

20. The method of claim 15, further comprising forming an inorganic insulation layer in the non-bending area,
wherein the crack prevention pattern and the inorganic insulation layer are simultaneously formed.

* * * * *